US012660617B2

(12) United States Patent
Shimazu et al.

(10) Patent No.: US 12,660,617 B2
(45) Date of Patent: Jun. 16, 2026

(54) POWER SEMICONDUCTOR DEVICE

(71) Applicant: Hitachi Astemo, Ltd., Hitachinaka (JP)

(72) Inventors: Hiromi Shimazu, Tokyo (JP); Yujiro Kaneko, Hitachinaka (JP); Yusuke Takagi, Hitachinaka (JP)

(73) Assignee: Hitachi Astemo, Ltd., Hitachinaka (JP)

(*) Notice: Subject to any disclaimer, the term of this patent is extended or adjusted under 35 U.S.C. 154(b) by 361 days.

(21) Appl. No.: 18/274,747

(22) PCT Filed: Dec. 24, 2021

(86) PCT No.: PCT/JP2021/048274
§ 371 (c)(1),
(2) Date: Jul. 28, 2023

(87) PCT Pub. No.: WO2022/209083
PCT Pub. Date: Oct. 6, 2022

(65) Prior Publication Data
US 2024/0096727 A1 Mar. 21, 2024

(30) Foreign Application Priority Data

Mar. 29, 2021 (JP) ................................. 2021-056155

(51) Int. Cl.
*H10W 40/22* (2026.01)
*H10W 70/40* (2026.01)
*H10W 90/00* (2026.01)

(52) U.S. Cl.
CPC ......... *H10W 40/22* (2026.01); *H10W 70/461* (2026.01); *H10W 70/481* (2026.01); *H10W 90/736* (2026.01)

(58) Field of Classification Search
CPC ............. H01L 23/367; H01L 23/49562; H01L 23/49568; H01L 24/32; H01L 2224/32245;
(Continued)

(56) References Cited

U.S. PATENT DOCUMENTS

2016/0197028 A1* 7/2016 Yamada ................ H01L 23/473
257/714
2019/0057928 A1* 2/2019 Kawashima ............ H01L 23/42
2022/0013432 A1 1/2022 Shimazu et al.

FOREIGN PATENT DOCUMENTS

JP 2002-260936 A 9/2002
JP 2009-59887 A 3/2009
(Continued)

OTHER PUBLICATIONS

International Search Report (PCT/ISA/210) issued in PCT Application No. PCT/JP2021/048274 dated Mar. 29, 2022 with English translation (4 pages).
(Continued)

*Primary Examiner* — Patricia D Valenzuela
(74) *Attorney, Agent, or Firm* — Crowell & Moring LLP

(57) ABSTRACT

A first power semiconductor element and a second power semiconductor element of a power semiconductor device are such that, when heat generated by the first power semiconductor element is larger than heat generated by the second power semiconductor element, a first distance from an end of the first power semiconductor element to an end of the conductor plate is larger than a second distance from an end of the second power semiconductor element to an end, connected to the second power semiconductor element, of a second conductor plate.

11 Claims, 9 Drawing Sheets

(58) Field of Classification Search
CPC . H01L 25/072; H01L 23/4334; H01L 23/473;
H01L 25/18; H10W 40/22; H10W
70/461; H10W 70/481; H10W 90/736;
H10W 90/00; H10W 40/47; H10W
40/778
See application file for complete search history.

(56) References Cited

FOREIGN PATENT DOCUMENTS

| | | |
|---|---|---|
| JP | 2018-113343 A | 7/2018 |
| WO | WO 2015/186470 A1 | 12/2015 |
| WO | WO 2020/105407 A1 | 5/2020 |

OTHER PUBLICATIONS

Japanese-language Written Opinion (PCT/ISA/237) issued in PCT Application No. PCT/JP2021/048274 dated Mar. 29, 2022 (4 pages).
Japanese-language Office Action issued in Japanese Application No. 2021-056155 dated Aug. 27, 2024 with English translation (10 pages).

* cited by examiner

POWER SEMICONDUCTOR DEVICE

TECHNICAL FIELD

The present invention relates to a power semiconductor device.

BACKGROUND ART

In recent years, spreading of hybrid vehicles and electric vehicles is an urgent need to reduce environmental load. It is important that parts mounted on vehicles are downsized and manufactured at low cost. For example, improvement of power conversion devices to meet such requirements is made in a daily basis. Meeting such requirements results in devices having higher heat generation density. Heat generated by a power semiconductor device is large compared to other electronic components in a power conversion device, so that the cooling performance of power semiconductor devices need to be improved.

A background art of the present invention is a power semiconductor device disclosed in PTL 1 below. This power semiconductor device is a sealed body including a power semiconductor chip of which front and back surfaces are soldered to a conductive plate, and sealed by a resin with a conductor plate exposed. The sealed body is housed in a metal case having first and second heat dissipation members, and each of the first and second heat dissipation members is bonded to the conductor plate by an insulating adhesive (insulating member) having thermal conductivity. This prevents deterioration of heat dissipation performance of the device. An art that provides a highly reliable power semiconductor device that has heat resistance is disclosed.

CITATION LIST

Patent Literature

PTL 1: JP 2018-113343 A

SUMMARY OF INVENTION

Technical Problem

In a power cycle in which a power semiconductor chip is repetitively turned on and off, thermal stress is produced and increases. In this use environment where high temperature is loaded, high thermal stress is produced in an insulating resin having thermal conductivity and serving as a heat dissipation member at a joined portion between a heat generating portion and the heat dissipation member. This may cause separation of the insulating resin from a conductor plate, and disadvantageously deteriorates heat dissipation of a power conversion device.

An object of the present invention is to provide a power semiconductor device that can be downsized and also have improved reliability.

Solution to Problem

A power conversion device according to the present invention is a power semiconductor device including a power semiconductor element, a conductor plate connected to the power semiconductor element, and an insulating layer connected to a surface of the conductor plate, the surface being opposite to a surface connected to the power semiconductor element, where the power semiconductor element includes a first power semiconductor element and a second power semiconductor element, and when heat generated by the first power semiconductor element is larger than heat generated by the second power semiconductor element, a first distance from an end of the first power semiconductor element to an end of the conductor plate is larger than a second distance from an end of the second power semiconductor element to an end of the conductor plate.

Advantageous Effects of Invention

According to the present invention, a power semiconductor device that can be downsized and also have improved reliability can be provided.

BRIEF DESCRIPTION OF DRAWINGS

FIG. 3 is a cross-sectional view of a power semiconductor module illustrated in FIG. 2 but with a heat dissipation member removed.

FIG. 5 is a cross-sectional view of a power semiconductor module according to a second embodiment of the present invention.

FIG. 6 is a cross-sectional view illustrated in FIG. 5 but with a flow path including body removed.

Figure 1:
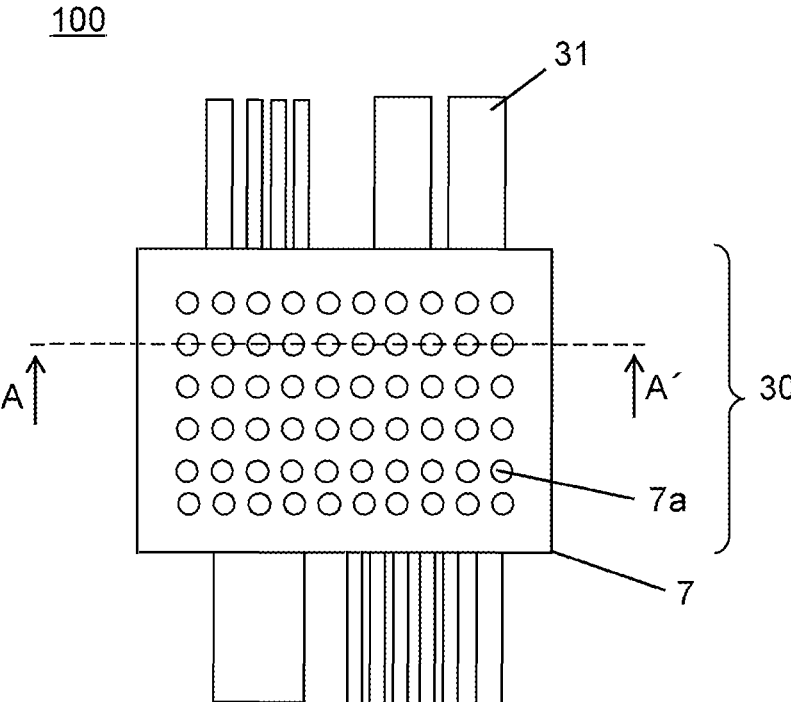
FIG. 1 is an external plan view of a power module according to a first embodiment of the present invention.

Hereinafter, embodiments of the present invention will be described with reference to the drawings. In the following description and drawings which are illustration for describing the present invention, omission and simplification are made as appropriate for clarification of description. The present invention can be carried out in other various forms. Unless otherwise specified, the number of each component may be one or more.

Positions, sizes, shapes, and ranges, for example, of components illustrated in the drawings may not represent actual positions, sizes, shapes, and ranges. This is for facilitating understanding of the invention. Thus, the present invention is not necessarily limited to positions, sizes, shapes, and ranges, for example, disclosed in the drawings.

First Embodiment and Overall Configuration

Figure 2:
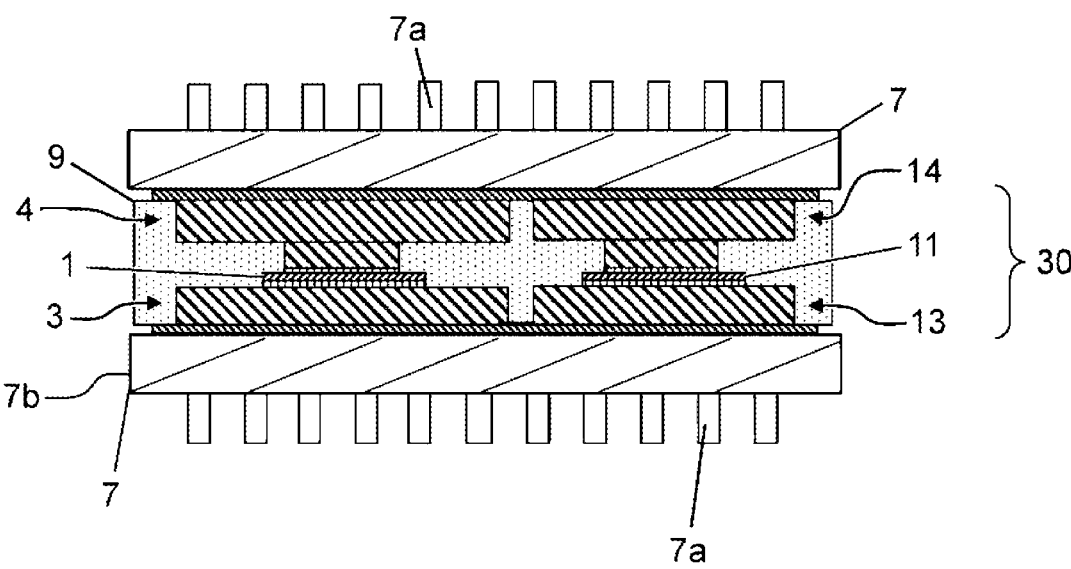
FIG. 2 is a cross-sectional view taken along line A-A' in FIG. 1.

FIG. 1 is an external plan view of a power module according to a first embodiment of the present invention. FIG. 2 is a cross-sectional view taken along line A-A' in FIG. 1. The line A-A' is a section line drawn across a power semiconductor element.

In the power module 100, a power semiconductor module 30 is sandwiched by heat dissipation members 7 along a direction across two surfaces (two surfaces on the closer side and the further side with respect to a viewer looking FIG. 1) of the power semiconductor module 30, and is connected to the heat dissipation members 7. The power semiconductor module 30 includes an external terminal 31 (only illustrated in FIG. 1) that protrudes to the outside of constituent parts of the power semiconductor module 30. By the external terminal 31, the power semiconductor module 30 is connected to another component mounted inside a power conversion device on which the power module 100 is mounted.

The heat dissipation member 7 is a metal member having thermal conductivity and electrical conductivity, and includes a plurality of heat dissipation fins 7a on a surface opposite to a surface connected to the power semiconductor module 30. Heat generated by the power semiconductor module 30 is dissipated by the heat dissipation fins 7a. Note that, the heat dissipation fin 7a formed as a pin fin may be a fin of different shape, for example, a straight fin or a corrugated fin.

The heat dissipation member 7 is made of, for example, Cu, a Cu alloy, or a composite material such as Cu—C and Cu—CuO, or alternatively Al, an Al alloy, or a composite material such as AlSiC and Al—C.

A heat dissipation member end 7b (FIG. 2) is a surface to be joined to a case (not illustrated) of the power conversion device. As a method of joining the heat dissipation member end 7b to the case, for example, friction stir welding (FSW), laser welding, or brazing can be used. By using such joining, when the power module 100 is inserted into a flow path of a power conversion device in which a refrigerant such as water, oil, or organic substance is flowing, the refrigerant does not enter the inside of the power semiconductor module 30.

A pair of separate heat dissipation members 7 sandwiching the power semiconductor module 30 is illustrated as two members of the same material. However, a pair of separate heat dissipation members 7 may be two members of different materials as long as the members dissipate heat. The sandwiching heat dissipation members 7 are illustrated as separate members, but may be integrated.

The power semiconductor module 30 includes a first power semiconductor element 1, a second power semiconductor element 11, a first conductor plate 3 and a third conductor plate 4 connected to the first power semiconductor element 1, and a second conductor plate 13 and a fourth conductor plate 14 connected to the second power semiconductor element 11. Sealing resin 9 is molded in the power semiconductor module 30 to reinforce connection and fixation of components.

Figure 3:
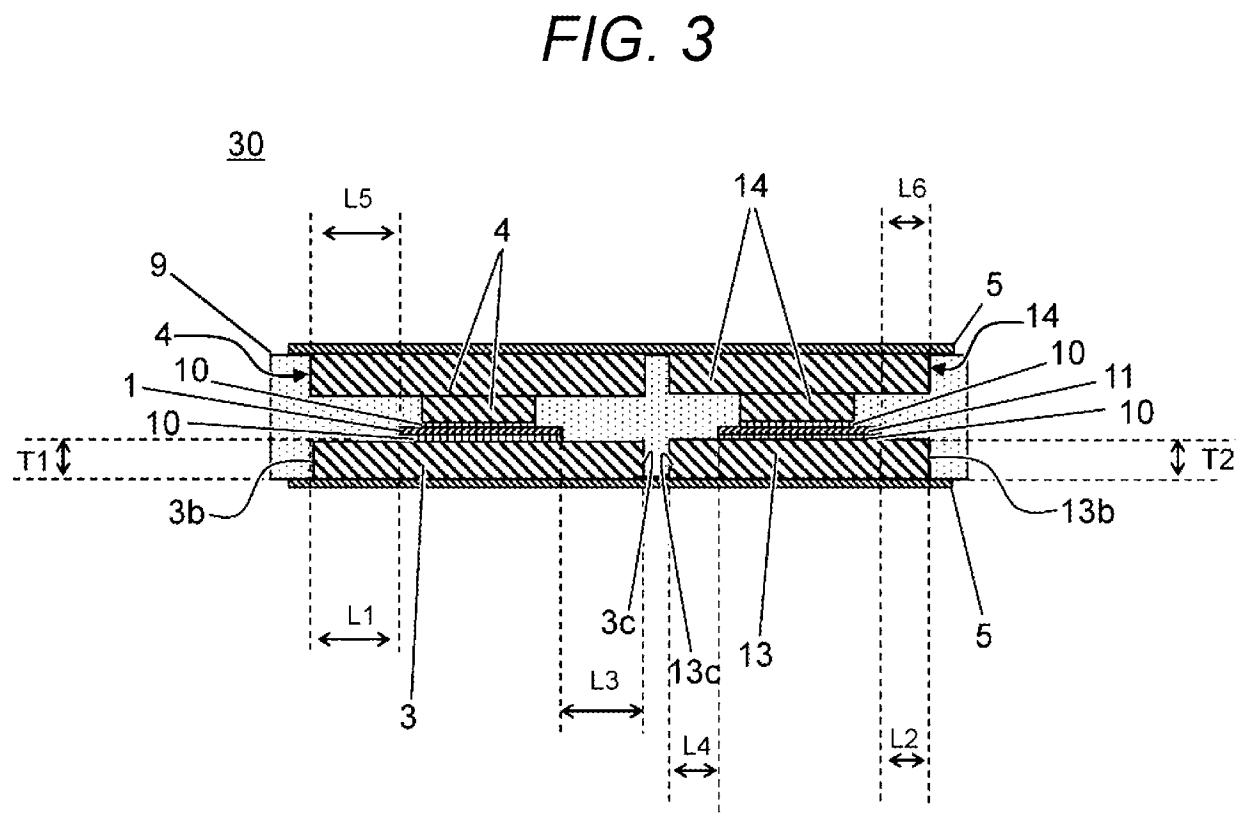

FIG. 3 is a cross-sectional view of the power semiconductor module illustrated in FIG. 2 but with the heat dissipation members removed.

In the power semiconductor module 30, the distance from one end of the first power semiconductor element 1 to one end 3b, on the same side, of the first conductor plate 3 is defined as first length L1, the distance from one end of the second power semiconductor element 11 to one end 13b, on the same side, of the second conductor plate 13 is defined as second length L2, the distance from another end of the first power semiconductor element 1 to another end 3c, on the same side, of the first conductor plate 3 is defined as third length L3, the distance from another end of the second power semiconductor element 11 to another end 13c, on the same side, of the second conductor plate 13 is defined as fourth length L4, the distance from one end of the first power semiconductor element 1 to one end, on the same side, of the third conductor plate 4 is defined as fifth length L5, and the distance from one end of the second power semiconductor element 11 to one end, on the same side, of the fourth conductor plate 14 is defined as sixth length L6. The thickness of the first conductor plate 3 is defined as T1, and the thickness of the second conductor plate 13 is defined as T2.

Each of the first conductor plate 3 and the second conductor plate 13 is connected, by a surface opposite to a surface connected to the first power semiconductor element 1, to the heat dissipation member 7 (see FIG. 2) via an insulating layer 5. Each of the third conductor plate 4 and the fourth conductor plate 14 is connected, by a surface opposite to a surface connected to the second power semiconductor element 11, to the heat dissipation member 7 via an insulating layer 5. This allows heat to dissipate from the power semiconductor module 30 by thermal conduction in the insulating layer 5.

The first conductor plate 3, the second conductor plate 13, the third conductor plate 4, and the fourth conductor plate 14 are formed of, for example, copper, a copper alloy, aluminum, or an aluminum alloy.

Although not illustrated in FIG. 3, each of the first conductor plate 3, the second conductor plate 13, the third conductor plate 4, and the fourth conductor plate 14 is actually lead-connected to an external substrate (not illustrated) or integrally formed with a lead as necessary.

The insulating layer 5 is an insulating member having a high thermal conductivity, and is formed of a material having a large dielectric strength voltage. For example, as a material of the insulating layer 5, a fine powder of aluminum oxide (alumina) or aluminum nitride, or an insulating sheet or an adhesive containing carbon, for example, can be used.

In FIG. 3, regarding the up-down direction, the insulating layer 5 covers the lower surface of the first conductor plate 3, the lower surface of the second conductor plate 13, the upper surface of the third conductor plate 4, and the upper surface of the fourth conductor plate 14, which are exposed surfaces of portions of the power semiconductor module 30 not covered with the mold resin 9. The lower surface of the first conductor plate 3 and the lower surface of the second conductor plate 13 are flush with the lower surface of the sealing resin 9. The upper surface of the third conductor plate 4 and the upper surface of the fourth conductor plate 14 are flush with the upper surface of the sealing resin 9.

The first conductor plate 3 to which the first power semiconductor element 1 is joined and the second conductor plate 13 to which the second power semiconductor element 11 is joined are disposed adjacent to each other. The third conductor plate 4 to which the first power semiconductor element 1 is joined and the fourth conductor plate 14 to which the second power semiconductor element 11 is joined are disposed adjacent to each other.

A bonding material 10 having thermal conductivity is provided between the first power semiconductor element 1 and the first conductor plate 3, between the first power semiconductor element 1 and the third conductor plate 4, between the second power semiconductor element 11 and the second conductor plate 13, and between the second power semiconductor element 11 and the fourth conductor plate 14.

The first to sixth lengths L1 to L6 defined in FIG. 3 will be described. The first power semiconductor element 1 is a power semiconductor element having a loss greater than the loss of the second power semiconductor element 11. When a vehicle is being driven, the first power semiconductor element 1 produces a larger amount of heat than the second power semiconductor element 11. Thus, the average temperature of the first power semiconductor element 1 becomes higher than the average temperature of the second power semiconductor element 11. In this case, for example, the first power semiconductor element 1 is an insulated gate bipolar transistor (IGBT), and the second power semiconductor element 11 is a diode.

In a cross section perpendicular to the bonding surface between the first conductor plate 3 and the first power semiconductor element 1 and intersecting the first power semiconductor element 1, the first length L1 is defined as the distance from an end of the first power semiconductor element 1 to the end 3b of the first conductor plate 3, and the third length L3 is defined as the distance from an end of the first power semiconductor element 1 to the end 3c of the first conductor plate 3.

In a cross section perpendicular to the bonding surface between the first conductor plate 3 and the second power semiconductor element 11 and intersecting the second power semiconductor element 11, the second length L2 is defined as the distance from an end of the second power semiconductor element 11 to the end 13b of the second conductor plate 13, and the fourth length L4 is defined as the distance from an end of the second power semiconductor element 11 to the end 13c of the second conductor plate 13.

The first power semiconductor element 1 and the second power semiconductor element 11 are disposed on the first conductor plate 3 and the second conductor plate 13, respectively, so as the first length L1 to be larger than the second length L2. More specifically, the first power semiconductor element 1 and the second power semiconductor element 11 are disposed so as only the second length L2 to be small compared to a conventional configuration in which the first length L1 and the second length L2 are substantially the same. This configuration is taken considering that thermal stress produced when the power semiconductor module 30 is driven may cause damage such as peeling and cracking of the insulating layer 5.

For example, when the power semiconductor module 30 is driven in a state cooled by a cooling medium such as the heat dissipation member 7 and the first power semiconductor element 1 and the second power semiconductor element 11 are energized, the first power semiconductor element 1 and the second power semiconductor element 11 generate heat and raise the temperature inside the power module 100.

The members deform to elongate by the temperature rise but by different amounts. In particular, thermal stress is produced in the insulating layers 5 by differences in deformation amount between the conductor plates 3, 13, 4, and 14 and the heat dissipation member 7. The greatest factor of thermal stress produced in the insulating layer 5 is the temperature of the conductor plate ends 3b and 13b. Thermal stress is higher for higher temperature of the conductor plate ends 3b and 13b. Note that, the power semiconductor element 1 and the power semiconductor element 11, which are heat generating elements, have the highest temperature, and the next highest temperature is those of the conductor plates 3, 13, 4, and 14 (in no particular order), the next highest temperature is of the insulating layer 5, and the next highest temperatures is of the heat dissipation member 7.

In a method to avoid thermal stress affecting the insulating layer 5, the first length L1 and the second length L2 are set large to give a long distance between the first power semiconductor element 1 and the first conductor plate end 3b and between the second power semiconductor element 11 and the second conductor plate end 13b, to suppress the rise in temperature of the ends 3b and 13b caused by the heat generated by the first power semiconductor element 1 and the second power semiconductor element 11 which are heat generating bodies. Adopting this method may prevent damage to the insulating layer 5 due to thermal stress but may increase the size of the power module 100.

Since the first power semiconductor element 1 generates a larger amount of heat than the second power semiconductor element 11, the thermal stress in the insulating layer 5 for the first conductor plate 3 applied by the first conductor plate end 3b is greater than the thermal stress in the insulating layer 5 for the second conductor plate 13 applied by the second conductor plate end 13b. Therefore, when the first length L1 and the second length L2 are the same, the temperature of the first conductor plate end 3b becomes higher than the temperature of the second conductor plate end 13b during the driving. Thus, damage such as peeling and cracking of the insulating layer 5 due to a difference in elongating deformation amount is likely to occur.

For this reason, the first power semiconductor element 1 and the second power semiconductor element 11 are disposed on the first conductor plate 3 and the second conductor plate 13, respectively, so as the first length L1 to be larger than the second length L2. Accordingly, the second length L2 can be determined by decreasing only the size of the second conductor plate 13, which is joined to the second power semiconductor element 11 that generates a small amount of heat and thus does not affect much the thermal stress in the insulating layer 5, without increasing the maximum thermal stress in the insulating layer 5. In this manner, the power module 100 can be downsized while maintaining reliability.

The relationship between the third length L3 and the fourth length L4 is the same as the relationship between the first length L1 and the second length L2.

In addition, with a combination of setting the first length L1 larger than the first conductor plate thickness T1 and setting the second length L2 larger than the second conductor plate thickness T2, heat generated by the power semiconductor elements 1 and 11 spreads, and thereby an effect of improving heat dissipation can be obtained.

Furthermore, giving a smaller area to the second power semiconductor element than the first power semiconductor element 1 can further downsize the power module 100.

The fifth length L5 is larger than the sixth length L6. This enables downsizing the conductor plates 4 and 14 while preventing damage to the insulating layers 5 connected to the third conductor plate 4 and the fourth conductor plate 14 due to thermal stress at the ends of the conductor plates 4 and 14.

The relationship between the first length L1 and the fifth length L5 is L1≥L5, and the relationship between the second length L2 and the sixth length L6 is L2≥L6. This enables downsizing while preventing damage to the insulating layer 5.

Figure 4:
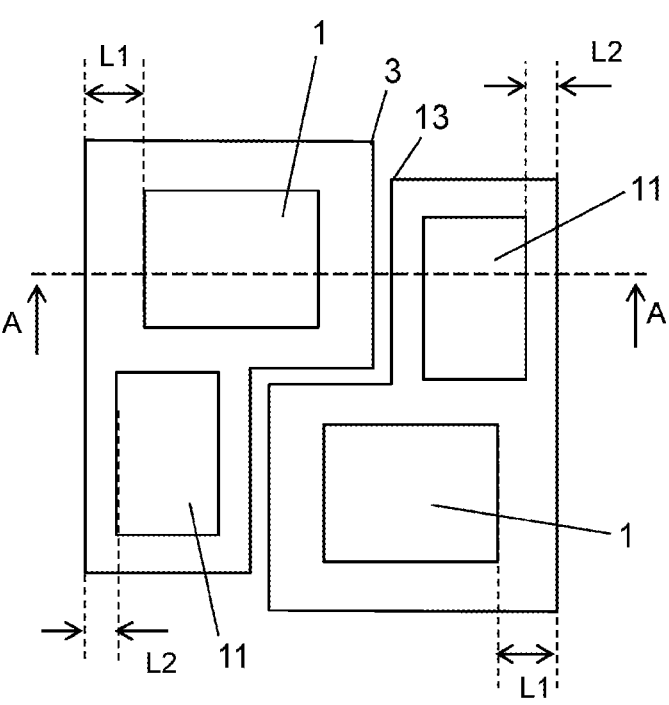
FIG. 4 is a chip layout diagram of the power semiconductor module according to the first embodiment of the present invention.

FIG. 4 is a chip layout diagram of the power semiconductor module according to the first embodiment of the present invention.

Figure 5:
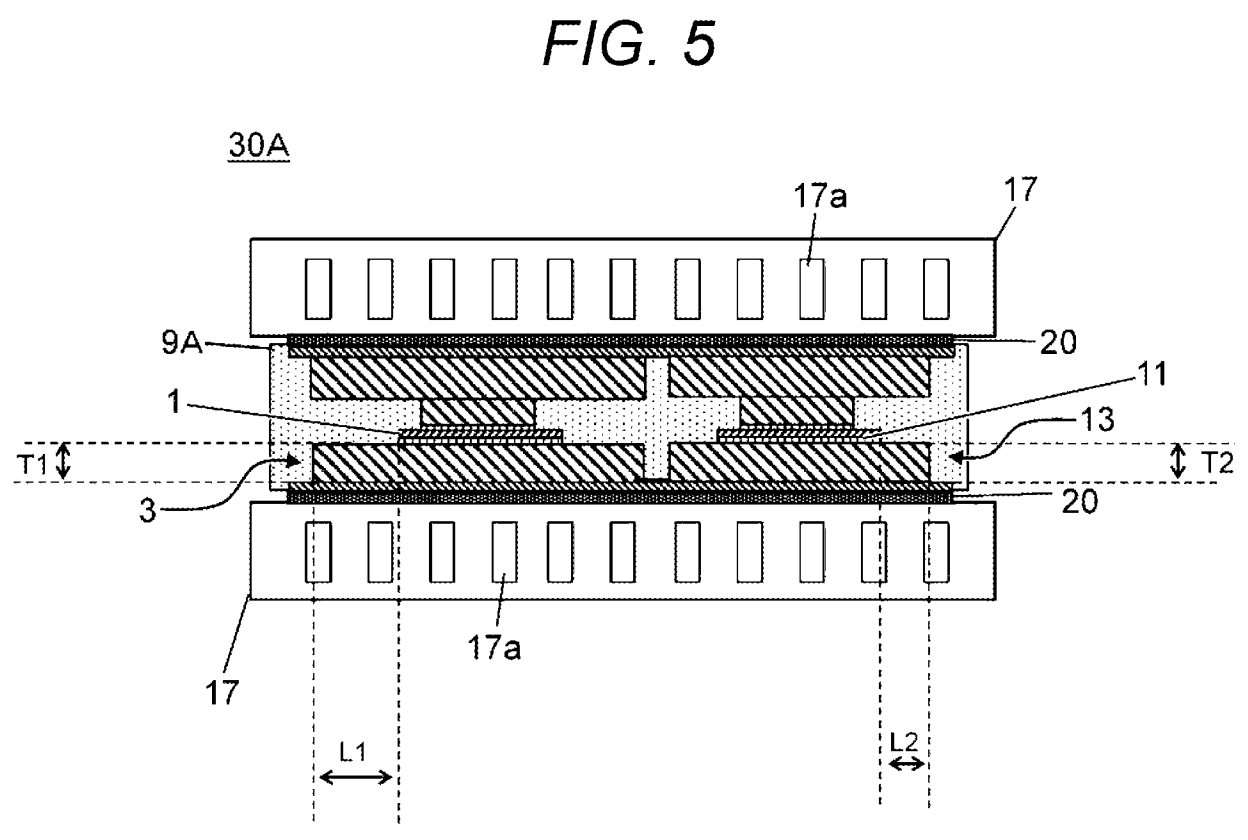

FIG. 5 is a plan layout diagram of the first power semiconductor element 1 and the second power semiconductor element 11. In FIG. 5, one first power semiconductor element 1 and one second power semiconductor element 11 are disposed on the first conductor plate 3. Similarly, one first power semiconductor element 1 and one second power semiconductor element 11 are disposed on the second conductor plate 13. The first conductor plate 3 and the second conductor plate are adjacently disposed and are electrically separated. Section line A-A' is at the same position as the section line A-A' illustrated in FIG. 1.

The aspect ratio (length-to-breadth ratio) of the first power semiconductor element 1 is smaller than the aspect ratio of the second power semiconductor element 11. The first conductor plate 3 and the second conductor plate 13 are adjacently disposed in an arrangement of meshing L-shapes.

With this arrangement, an effect of downsizing the power semiconductor module 30 (see FIG. 3) can also be obtained. This suppresses damage to the insulating member 5 connected to a conductor plate end of the power semiconductor module 30 and thus improves heat dissipation performance of the power semiconductor module 30, and a highly reliable power conversion device can be obtained.

According to the embodiment described above, the power module 100 has a structure in which the insulating layer 5 is sealed together with the conductor plates 3, 13, 4, and 14 by the sealing resin 9, so that the difference in thermal deformation between the conductor plates 3, 13, 4, and 14 and the insulating layer 5 caused by the rise in temperature that happens when the power semiconductor elements 1 and 11 generate heat is small, and thus the thermal stress produced in the insulating layer 5 connected to the conductor plate ends 3b and 13b is small. Accordingly, damage is less likely to occur. Thus, a power semiconductor device that is further highly reliable can be provided.

Second Embodiment

Figure 6:
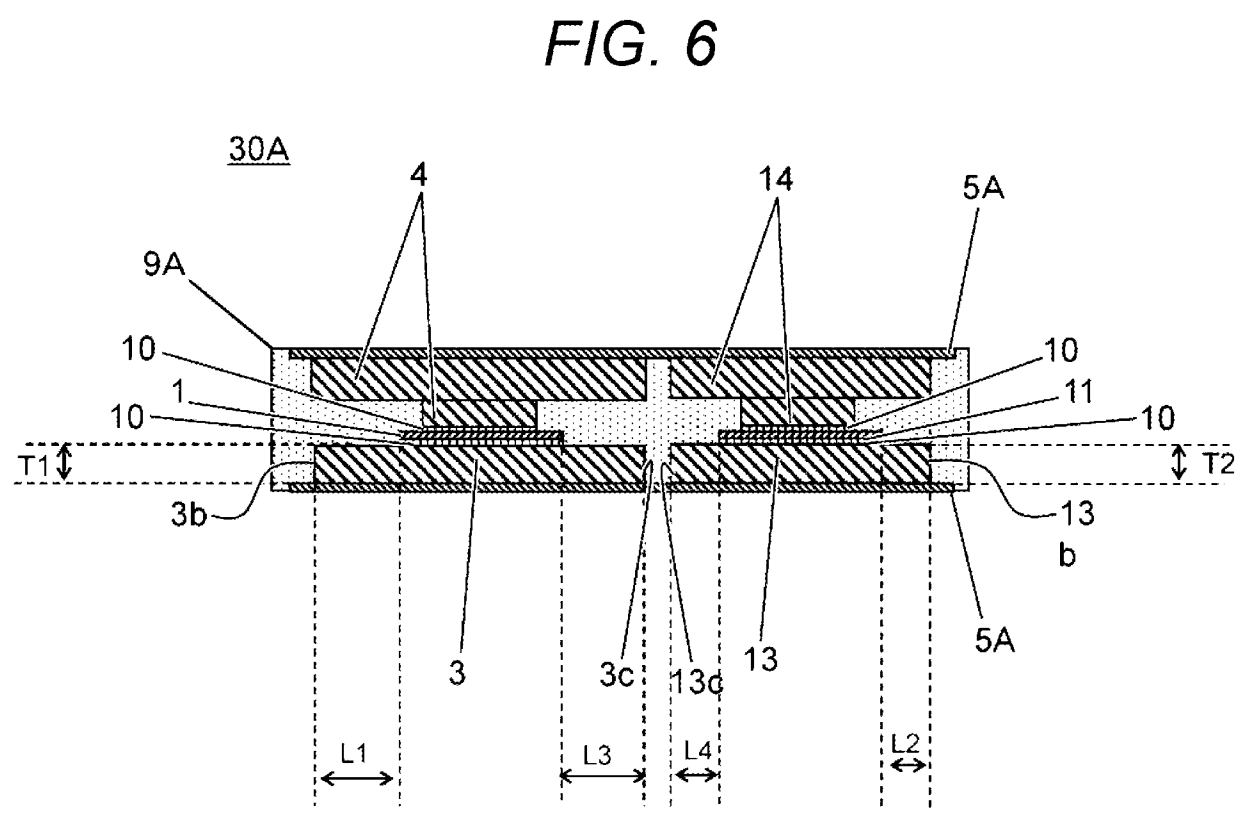

FIG. 5 is a cross-sectional view of a power semiconductor module according to a second embodiment of the present invention. FIG. 6 is a cross-sectional view illustrated in FIG. 5 but with a flow path including body removed.

In a power semiconductor module 30A, each of a first conductor plate 3, a second conductor plate 13, a third conductor plate 4, and a fourth conductor plate 14 is connected to an insulating layer 5A, and the insulating layer 5A is connected to a heat dissipation member (flow path including body) 17 via a connecting material 20. The heat dissipation member 17 has a flow path 17a, and a cooling medium that dissipates heat of the power semiconductor module 30A flows in the flow path 17a.

As illustrated in FIG. 6, the embodiment is sealed and fixed with sealing resin 9A so as a surface of the insulating layer 5A on a side opposite to a surface connected to the conductor plates 3, 13, 4, and 14 to be exposed. This enables sealing and fixing of the power semiconductor module 30A including the insulating layers 5A.

(First Exemplary Modification, Second Exemplary Modification)

Figure 7:
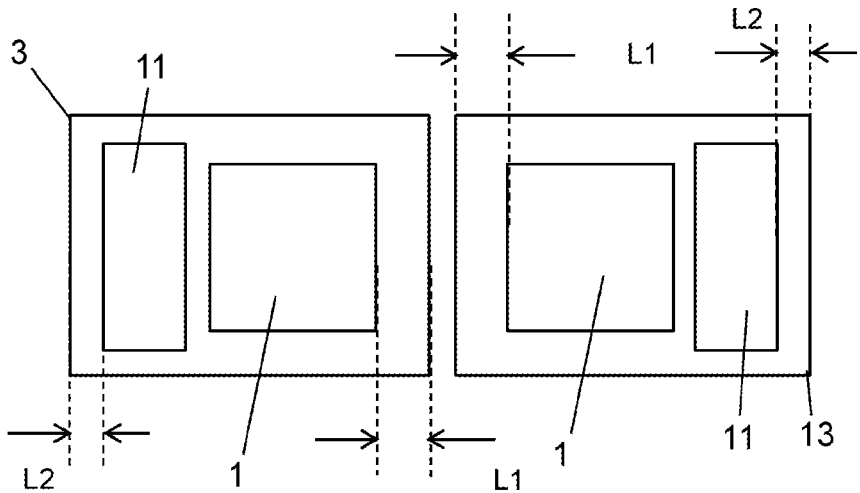
FIG. 7 is a first exemplary modification of FIG. 4.
Figure 8:
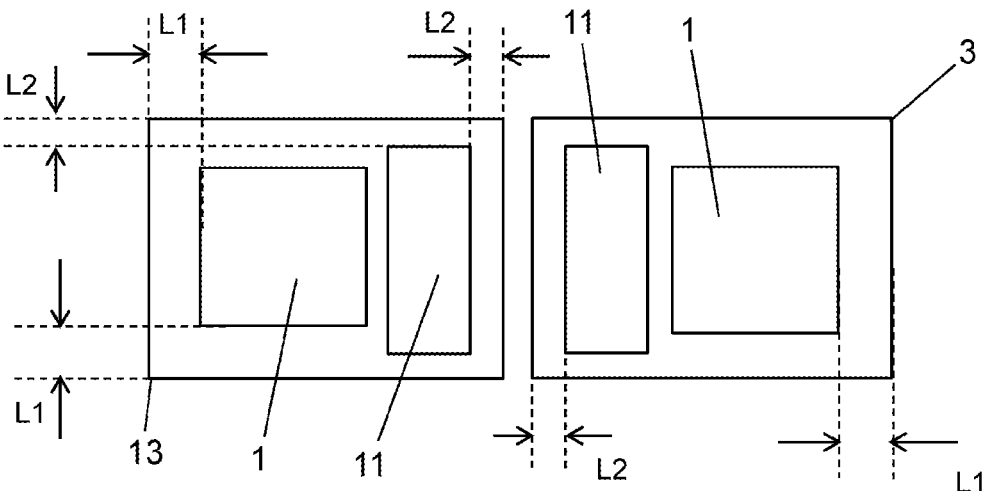
FIG. 8 is a second exemplary modification of FIG. 4.

FIGS. 7 and 8 illustrate a first exemplary modification and a second exemplary modification of the embodiment illustrated in FIG. 4.

In FIG. 4, the power semiconductor elements and the conductor plates are disposed in an L-shaped arrangement, but as illustrated in FIGS. 7 and 8, the first power semiconductor element 1 and the second power semiconductor element 11 can be disposed on each of the first conductor plate 3 and the second conductor plate 13 while maintaining the relationship between the first length L1 and the second length L2. The maximum side length of the first power semiconductor element 1 is smaller than the maximum side length of the second power semiconductor element 11.

Third Embodiment

Figure 9:
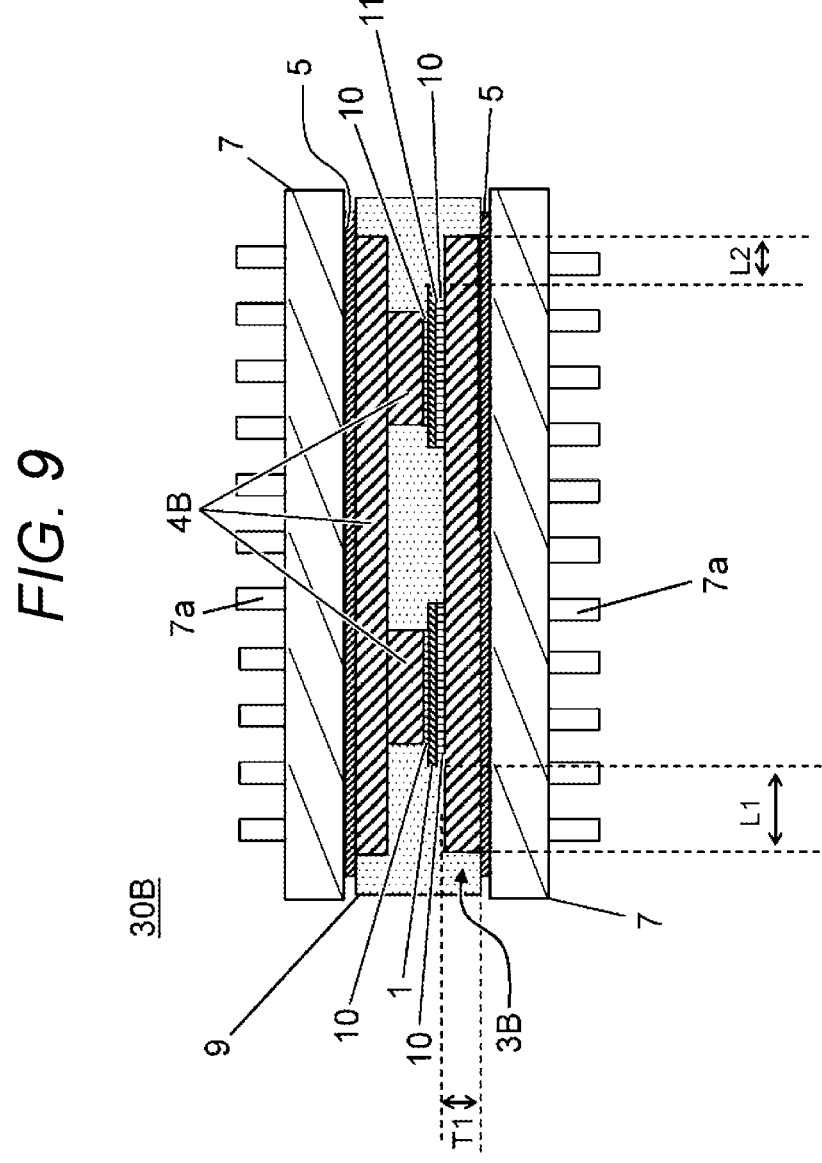
FIG. 9 is a cross-sectional view of a power semiconductor module according to a third embodiment of the present invention.

FIG. 9 is a cross-sectional view of a power semiconductor module according to a third embodiment of the present invention.

In a power semiconductor module 30B, a first conductor plate 3B is a single part on which a first power semiconductor element 1 and a second power semiconductor element 11 are disposed. A third conductor plate 4B is also a single part on which the first power semiconductor element 1 and the second power semiconductor element 11 are disposed on a side opposite to the side connected to the first conductor plate 3B. When disposing the first power semiconductor element 1 and the second power semiconductor element 11 on a conductor plate in this configuration, only first length L1 and second length L2 need to be considered and there is no need to consider inner ends 3c and 13c (see FIG. 3, FIG. 5), on the inner side, of conductor plates illustrated in the first embodiment.

In the embodiment, the first length L1 and the second length L2 are larger than first conductor plate thickness T1, so that the heat of the first power semiconductor element 1 and the second power semiconductor element 11 sufficiently spreads to improve heat dissipation.

Exemplified in the present embodiment is a 2-in-1 power semiconductor device, but the present invention can also be applied to a 1-in-1 power semiconductor device having a packaged structure in which an IGBT and a diode are connected to a single conductor plate, and also to a 6-in-1 power semiconductor device.

In the power semiconductor module 30 of the present embodiment, a heat dissipation member 7 may be connected by both ends of the heat dissipation member 7.

Fourth Embodiment

Figure 10:
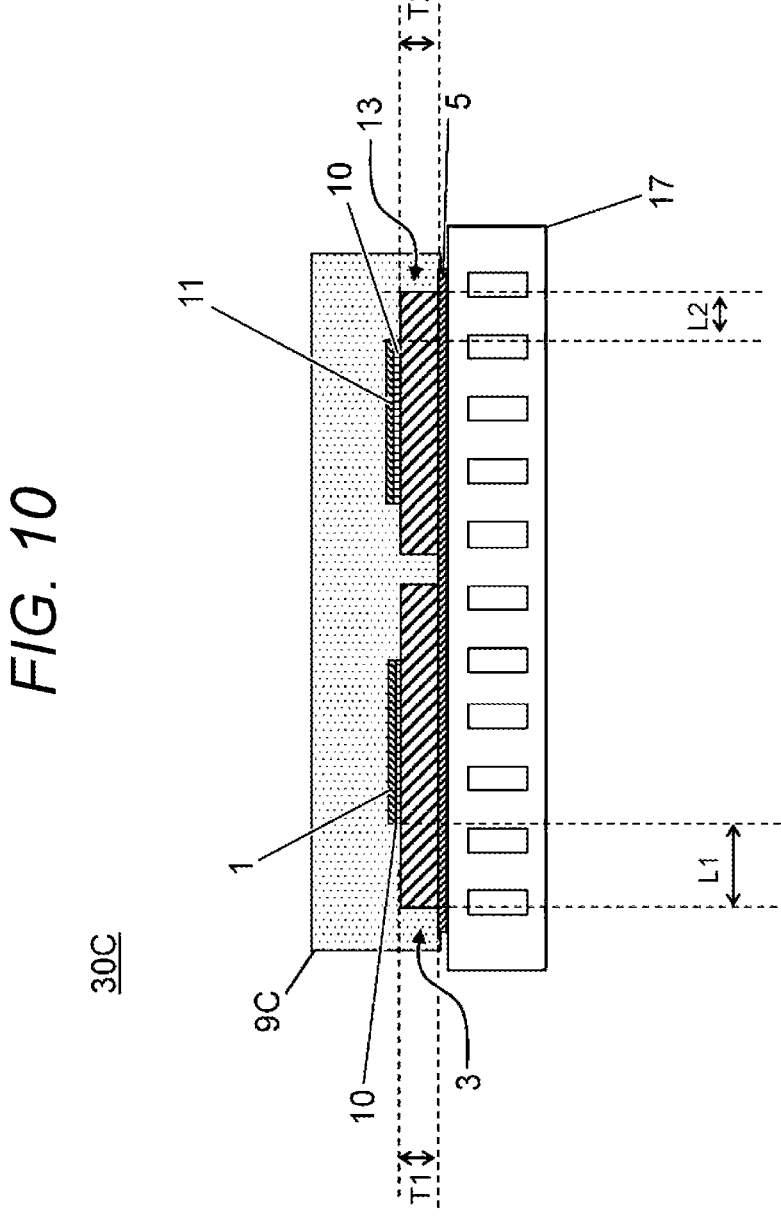
FIG. 10 is a cross-sectional view of a power semiconductor module according to a fourth embodiment of the present invention.

FIG. 10 is a cross-sectional view of a power semiconductor module according to a fourth embodiment of the present invention.

The power semiconductor module 30C of the present embodiment has a structure in which a heat dissipation member 17 is provided only on one side for cooling. In this structure, an insulating layer 5 is provided only on the side where the heat dissipation member 17 is provided, and this contributes to further downsizing of a power conversion device.

According to the first and second embodiments of the present invention described above, the following effect is obtained.

(1) A power semiconductor device includes a power semiconductor element, a conductor plate connected to the power semiconductor element, and the insulating layer 5 connected to a surface of the conductor plate opposite to the surface connected to the power semiconductor element. The power semiconductor element includes the first power semiconductor element 1 and the second power semiconductor element 11. When the heat generated by the first power semiconductor element 1 is larger than the heat generated by the second power semiconductor element 11, the first distance L1 which is the distance from an end of the first power semiconductor element 1 to the first conductor plate end 3b (3c) is larger than the second distance L2 which is the distance from an end of the second power semiconductor element 11 to the second conductor plate end 13b (13c). This provides a power semiconductor device that can be downsized and also have improved reliability.

(2) The conductor plate includes the first conductor plate 3 connected to the first power semiconductor element 1 and the second conductor plate 13 connected to the second power semiconductor element 11. In a cross section perpendicular to the bonding surface between the first conductor plate 3 and the first power semiconductor element 1 and intersecting the first power semiconductor element 1, the first length L1 (L3) is defined as the distance from an end of the first power semiconductor element 1 to the first conductor plate end 3b (3c). In a cross section perpendicular to the bonding surface between the second conductor plate 13 and the second power semiconductor element 11 and intersecting the second power semiconductor element 11, the second length L2 (L4) is defined as the distance from an end of the second power semiconductor element 11 to the second conductor plate end 13b (13c). Accordingly, the first distance L1 and the second distance L2 that provide the effect of the present invention can be defined.

(3) When the first power semiconductor element 1 and the second power semiconductor element 11 are disposed on the same conductor plate 3B, the first distance L1 is defined, in a cross section perpendicular to the bonding surface between the conductor plate 3B and the first power semiconductor element 1 and intersecting the first power semiconductor element 1, as the distance from an end of the first power semiconductor element 1 to an end of the conductor plate 3B. In a cross section perpendicular to the bonding surface between the conductor plate 3B and the second power semiconductor element 11 and intersecting the second power semiconductor element 11, the second length L2 is defined as the distance from an end of the second power semiconductor element 11 to an end of the conductor plate 3B. Accordingly, the first distance L1 and the second distance L2 that provide the effect of the present invention can be defined for another embodiment.

(4) The third conductor plate 4 is connected to a surface of the first power semiconductor element 1 opposite to the surface connected to the first conductor plate 3, the fourth conductor plate 14 is connected to a surface of the second power semiconductor element 11 opposite to the surface connected to the second conductor plate 13, and each of the first to fourth conductor plates 3, 13, 4, and 14 is connected to the heat dissipation member 7 via the insulating layer 5 by a surface opposite to the surface connected to the corresponding one of the first power semiconductor element 1 and the second power semiconductor element 11. This enables cooling both surfaces of the power module 100.

(5) The first power semiconductor element 1 has a greater loss than the second power semiconductor element 11. For this arrangement, the first distance L1 and the second distance L2 that provide the effect of the present invention are necessary.

(6) The first power semiconductor element 1 is an IGBT, and the second power semiconductor element 11 is a diode. For this arrangement, the first distance L1 and the second distance L2 that provide the effect of the present invention are necessary.

(7) The aspect ratio of the first power semiconductor element 1 is smaller than the aspect ratio of the second power semiconductor element 11. This increases the degree of freedom of arrangement of power semiconductor elements on a conductor plate while maintaining the first distance L1 and the second distance L2 that provide the effect of the present invention.

(8) The maximum side length of the first power semiconductor element 1 is smaller than the maximum side length of the second power semiconductor element 11. This increases the degree of freedom of arrangement of power semiconductor elements on a conductor plate while maintaining the first distance L1 and the second distance L2 that provide the effect of the present invention.

(9) The third distance L3 which is the distance from an end of the first power semiconductor element 1 to an end of the third conductor plate 4 is larger than the fourth distance L4 which is the distance from an end of the second power semiconductor element 11 to an end of the fourth conductor plate 14. This avoids damage such as peeling and cracking of the insulating layer 5 on either side of the power module 100 of which both sides are cooled.

(10) The first distance L1 is equal to or larger than the third distance L3, and the second distance L2 is equal to or larger than the fourth distance L4. This avoids damage such as peeling and cracking of the insulating layer 5 on either side of the power module 100 of which both sides are cooled.

(11) The power semiconductor module 30 is connected to the heat dissipation member 7 at both ends of the heat dissipation member 7. This significantly provides the effect of the present invention at an end where damage such as peeling and cracking of the insulating layer 5 is likely to occur.

In the present invention, a conductor plate end may have a tapered shape. When a conductor plate end has a tapered shape, it is desirable that, from the insulating layer connected to the first conductor plate and the second conductor plate as a plane, the surface of the conductor plate end extends from the corner of the conductor plate end in contact with the insulating layer in a direction toward an end of the power semiconductor element at an angle of 45 degrees or less.

The present invention is not limited to the above embodiments, and various modifications and other configurations can be combined without departing from the gist of the present invention. The present invention is not limited to that including all the configurations described in the above embodiment, and includes those not including part of the configurations.

REFERENCE SIGNS LIST 1 first power semiconductor element
3, 3B first conductor plate
3b first conductor plate end (outer side)
3c first conductor plate end (inner side)
4, 4B third conductor plate
5, 5A insulating layer
7 heat dissipation member (fin type)
7a heat dissipation fin
7b heat dissipation member end
9, 9A, 9C sealing resin
10 bonding material
11 second power semiconductor element
13 second conductor plate
13b second conductor plate end (outer side)
13c second conductor plate end (inner side)
14 fourth conductor plate
17 heat dissipation member (flow path including body)
17a flow path
20 connecting material (heat conducting body)
30, 30A to 30C power semiconductor module
31 external terminal
100 power module
L1 to L6 first to sixth lengths
T1 first conductor plate thickness
T2 second conductor plate thickness

The invention claimed is:

1. A power semiconductor device comprising:

a power semiconductor element;

a conductor plate connected to the power semiconductor element; and an insulating layer connected to a surface of the conductor plate, the surface being opposite to a surface connected to the power semiconductor element, wherein the power semiconductor element includes a first power semiconductor element and a second power semiconductor element, when heat generated by the first power semiconductor element is larger than heat generated by the second power semiconductor element, a first distance from an end of the first power semiconductor element to an end of the conductor plate is larger than a second distance from an end of the second power semiconductor element to an end of the conductor plate, and the first distance is greater than a thickness of the conductor plate such that heat generated by the first power semiconductor element spreads within the conductor plate to reduce a temperature at the end of the conductor plate and thereby suppress thermal stress in the insulating layer.

2. The power semiconductor device according to claim 1, wherein the conductor plate includes a first conductor plate connected to the first power semiconductor element and a second conductor plate connected to the second power semiconductor element, the first distance is defined, in a cross section perpendicular to a bonding surface between the first conductor plate and the first power semiconductor element and intersecting the first power semiconductor element, as a distance from the end of the first power semiconductor element to the end of the first conductor plate, and the second distance is defined, in a cross section perpendicular to a bonding surface between the second conductor plate and the second power semiconductor element and intersecting the second power semiconductor element, as a distance from the end of the second power semiconductor element to the end of the second conductor plate.

3. The power semiconductor device according to claim 1, wherein the first power semiconductor element and the second power semiconductor element are disposed together on the conductor plate, the first distance is defined, in a cross section perpendicular to a bonding surface between the conductor plate and the first power semiconductor element and intersecting the first power semiconductor element, as a distance from the end of the first power semiconductor element to the end of the conductor plate, and the second distance is defined, in a cross section perpendicular to a bonding surface between the conductor plate and the second power semiconductor element and intersecting the second power semiconductor element, as a distance from the end of the second power semiconductor element to the end of the conductor plate.

4. The power semiconductor device according to claim 1, wherein a third conductor plate is connected to a surface of the first power semiconductor element, the surface being opposite to a surface connected to the first conductor plate, a fourth conductor plate is connected to a surface of the second power semiconductor element, the surface being opposite to a surface connected to the second conductor plate, and a surface of each of the first to fourth conductor plates is connected to a heat dissipation member via the insulating layer, the surface being opposite to a surface connected to a corresponding one of the first power semiconductor element and the second power semiconductor element.

5. The power semiconductor device according to claim 1, wherein the first power semiconductor element has a loss greater than a loss of the second power semiconductor element.

6. The power semiconductor device according to claim 1, wherein the first power semiconductor element is an insulated gate bipolar transistor (IGBT), and the second power semiconductor element is a diode.

7. The power semiconductor device according to claim 1, wherein the first power semiconductor element has an aspect ratio smaller than an aspect ratio of the second power semiconductor element.

8. The power semiconductor device according to claim 1, wherein a maximum side length of the first power semiconductor element is smaller than a maximum side length of the second power semiconductor element.

9. The power semiconductor device according to claim 4, wherein a third distance from an end of the first power semiconductor element to an end of the third conductor plate is larger than a fourth distance from an end of the second power semiconductor element to an end of the fourth conductor plate.

10. The power semiconductor device according to claim 9, wherein the first distance is equal to or larger than the third distance, and the second distance is equal to or larger than the fourth distance.

11. The power semiconductor device according to claim 4, wherein the heat dissipation member is connected by both ends of the heat dissipation member.

* * * * *